United States Patent
Yumita et al.

(10) Patent No.: US 9,884,564 B2
(45) Date of Patent: Feb. 6, 2018

(54) ELECTRICALLY POWERED VEHICLE AND POWER SUPPLY SYSTEM

(71) Applicant: TOYOTA JIDOSHA KABUSHIKI KAISHA, Toyota-shi, Aichi-ken (JP)

(72) Inventors: Osamu Yumita, Seto (JP); Daisuke Ueo, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 313 days.

(21) Appl. No.: 14/865,184

(22) Filed: Sep. 25, 2015

(65) Prior Publication Data

US 2016/0137086 A1    May 19, 2016

(30) Foreign Application Priority Data

Nov. 13, 2014    (JP) .................. 2014-230669

(51) Int. Cl.
| | |
|---|---|
| B60L 1/00 | (2006.01) |
| B60L 3/00 | (2006.01) |
| H02G 3/00 | (2006.01) |
| B60L 11/18 | (2006.01) |
| G01R 31/14 | (2006.01) |

(Continued)

(52) U.S. Cl.
CPC ......... B60L 11/1842 (2013.01); B60L 3/0069 (2013.01); B60L 3/04 (2013.01); B60R 16/03 (2013.01); G01R 31/14 (2013.01); Y02E 60/721 (2013.01); Y02T 10/7005 (2013.01); Y02T 10/7072 (2013.01); Y02T 90/121 (2013.01);

(Continued)

(58) Field of Classification Search
CPC ........ G01R 31/02; G01R 31/00; G01R 31/18; G01R 31/14; G01R 31/12; H02M 1/00; H06F 17/00; H02J 7/04; H02J 7/00; H02H 3/00; H02H 9/08; B60L 3/0069; G06F 19/00
USPC ........... 307/9.1, 10.1; 60/299; 324/509, 503, 324/512; 320/109; 361/109; 180/65.29; 701/22; 363/21.12, 146

See application file for complete search history.

(56) References Cited

U.S. PATENT DOCUMENTS 6,915,797 B1 * 7/2005 Lightbourne ............. F24C 7/10
                                                                  126/9 R
7,773,353 B2    8/2010 Uchida
(Continued)

FOREIGN PATENT DOCUMENTS

| JP | 2010-239773 A | 10/2010 |
|---|---|---|
| JP | 4635890 | 2/2011 |

(Continued)

*Primary Examiner* — Rexford Barnie
*Assistant Examiner* — Jagdeep Dhillon
(74) *Attorney, Agent, or Firm* — Finnegan, Henderson, Farabow, Garrett & Dunner, LLP

(57) ABSTRACT

A detector may be a device for detecting insulation decrease of an electric system included in a vehicle. An external terminal may be configured to be connectable with a terminal of a power supply cable connected to a power supply device. A power supply relay, which may be provided between the external terminal and a power line, may be controlled by a vehicle ECU to be in a closed state during external power supply from the electrically powered vehicle to the power supply device. When the insulation decrease of the electric system is detected by the detector, the vehicle ECU may control the power supply relay to come into an open state.

6 Claims, 5 Drawing Sheets

(51) Int. Cl.
*B60L 3/04* (2006.01)
*B60R 16/03* (2006.01)

(52) U.S. Cl.
CPC .............. *Y02T 90/128* (2013.01); *Y02T 90/14* (2013.01); *Y02T 90/163* (2013.01); *Y04S 10/126* (2013.01)

(56) References Cited

U.S. PATENT DOCUMENTS

| | | | | |
|---|---|---|---|---|
| 8,164,344 | B2* | 4/2012 | Yano | G01R 31/025 324/509 |
| 8,264,234 | B2* | 9/2012 | Yano | B60L 3/0046 324/509 |
| 2007/0217242 | A1* | 9/2007 | Dayan | H04L 12/66 363/146 |
| 2008/0197855 | A1* | 8/2008 | Uchida | G01R 27/025 324/509 |
| 2009/0002903 | A1* | 1/2009 | Uchida | B60L 3/00 361/49 |
| 2010/0213896 | A1* | 8/2010 | Ishii | B60L 3/0069 320/109 |
| 2010/0226151 | A1* | 9/2010 | Chen | H02M 3/335 363/21.12 |
| 2010/0268406 | A1* | 10/2010 | Ito | B60L 3/0023 701/22 |
| 2010/0318250 | A1* | 12/2010 | Mitsutani | B60K 1/02 701/22 |
| 2011/0273139 | A1 | 11/2011 | Hofheinz | |
| 2012/0249070 | A1 | 10/2012 | Sellner et al. | |
| 2012/0274131 | A1* | 11/2012 | Makino | B60L 3/0069 307/9.1 |
| 2013/0221975 | A1 | 8/2013 | Ward | |
| 2014/0109556 | A1 | 4/2014 | Hashimoto | |
| 2015/0291111 | A1 | 10/2015 | Suzuki | |
| 2016/0221444 | A1* | 8/2016 | Ben Ahmed | B60L 3/0069 |
| 2016/0377670 | A1* | 12/2016 | Tamida | G01R 27/025 324/551 |

FOREIGN PATENT DOCUMENTS

| | | |
|---|---|---|
| JP | 2013-198288 | 9/2013 |
| JP | 2014-83943 | 5/2014 |
| JP | 2014-192047 A | 10/2014 |
| WO | WO 2007/089037 A1 | 8/2007 |
| WO | WO 2014/103707 A1 | 7/2014 |

* cited by examiner

FIG.7

| MODE | DETERMINATION FOR INSULATION DECREASE IN VEHICLE | ACTION |
|---|---|---|
| EXTERNAL POWER SUPPLY | NORMAL | PERMIT EXTERNAL POWER SUPPLY |
| | MALFUNCTION (INSULATION DECREASE) | PROHIBIT EXTERNAL POWER SUPPLY |
| TRAVELING | NORMAL | PERMIT TRAVELING |
| | MALFUNCTION (INSULATION DECREASE) | PERMIT TRAVELING |

ELECTRICALLY POWERED VEHICLE AND POWER SUPPLY SYSTEM
===

This nonprovisional application is based on Japanese Patent Application No. 2014-230669 filed on Nov. 13, 2014, with the Japan Patent Office, the entire contents of which are hereby incorporated by reference.

BACKGROUND
===

Technical Field

The present disclosure relates to an electrically powered vehicle and a power supply system, particularly, an electrically powered vehicle capable of outputting electric power to outside the vehicle and a power supply system including such an electrically powered vehicle.

Description of Background Art

A power supply system has been known which employs, as a power source, an electrically powered vehicle including a DC power source, and which converts electric power using an external power supply device, and supplies it to a house or an electric appliance. For example, Japanese Patent Laying-Open No. 2013-198288 describes a power supply system that connects an external power supply device to an electrically powered vehicle, that converts DC power, which is sent from the electrically powered vehicle to the external power supply device, into AC power using an inverter of the external power supply device, and that supplies the AC power to an external load.

In these power supply systems, insulation decrease of the power supply system needs to be detected. When the insulation decrease of the power supply system is detected in the external power supply device (hereinafter, simply referred to as "power supply device"), which receives electric power from the electrically powered vehicle while the power supply device is electrically connected to the electrically powered vehicle, it cannot be determined in the power supply device whether the insulation decrease took place in the electrically powered vehicle or the power supply device.

When the power supply device is connected to an electrically powered vehicle having insulation decrease therein, the insulation decrease is detected in the power supply device and the power supply device accordingly cannot be used due to a safety function. In such a case, the power supply device cannot be used even though the power supply device itself is normal. Thus, convenience of the power supply system may be significantly deteriorated. For example, even when the power supply device is thereafter connected to a vehicle free from insulation decrease, electric power cannot be supplied from the vehicle.

SUMMARY
===

Embodiments of the present disclosure may solve such a problem, and may also improve convenience when insulation decrease takes place in a power supply system that employs an electrically powered vehicle.

According to the present disclosure, an electrically powered vehicle may include: an electric system included in the vehicle; a detecting device that detects insulation decrease of the electric system; and a control device that controls the electric system. The electric system may include: a driving system that generates driving power for traveling; an external terminal for outputting DC power from the driving system to outside the vehicle; and an opening/closing device provided in an electric path between the external terminal and the driving system. The external terminal may be configured to be connectable with a converter separated from the vehicle, the converter converting the DC power output from the external terminal into AC power and supplying the AC power to an external load. The control device may control the opening/closing device to open the opening/closing device when the insulation decrease of the electric system is detected by the detecting device.

With such a configuration, when the insulation decrease of the electric system is detected in the electrically powered vehicle, the electrically powered vehicle may be electrically separated from the power supply device by opening the opening/closing device. Accordingly, the power supply device can avoid being unused when the power supply device itself is normal after detecting the insulation decrease in the power supply device even though it may not be possible to determine whether the insulation decrease took place in the electrically powered vehicle or the power supply device. Therefore, according to the electrically powered vehicle, convenience can be improved when there is insulation decrease in the electrically powered vehicle.

When the insulation decrease of the electric system is detected by the detecting device, the control device may control the opening/closing device to open the opening/closing device and permit the vehicle to travel using the driving system.

With such a configuration, the electrically powered vehicle can travel even when the insulation decrease of the electric system is detected in the electrically powered vehicle, so that the electrically powered vehicle can travel to a service station or the like for the sake of inspection and repair. Therefore, convenience of the electrically powered vehicle can be improved.

The control device may stop an operation of the detecting device while the control device controls the opening and closing (opening/closing) device to close the opening/closing device.

With such a configuration, the detecting device included in the electrically powered vehicle can be prevented from interfering with another detecting device for detecting insulation decrease of the power supply system in the power supply device external to the vehicle.

The control device may control the opening/closing device to open the opening/closing device when receiving a notification from an external device while the control device controls the opening/closing device to close the opening/closing device. The external device may receive the DC power from the external terminal. The notification may indicate that insulation decrease has been detected in the external device.

With such a configuration, in the external device (power supply device), it is possible to avoid a situation where it cannot be determined whether the insulation decrease took place in the electrically powered vehicle or the external device.

The driving system may include a fuel cell, and a power storage device that stores electric power generated by the fuel cell.

According to the electrically powered vehicle, the external power supply from the power storage device can be promptly performed, and when an amount of charges stored in the power storage device is decreased, a large amount of electric power that can be generated by the fuel cell can be used for the external power supply by charging the power storage device using the fuel cell.

Moreover, according to the present disclosure, a power supply system may include: an electrically powered vehicle configured to output DC power to outside the vehicle; and a power supply device that converts, into AC power, the DC power output from the electrically powered vehicle and that supplies the AC power to an external load. The power supply device may include a first detecting device that detects insulation decrease of a power supply path to the external load when the power supply device is electrically connected to the electrically powered vehicle. The electrically powered vehicle may include: an electric system included in the vehicle; a second detecting device that detects insulation decrease of the electric system; and a control device that controls the electric system. The electric system may include: a driving system that generates driving power for traveling; an external terminal, configured to be connectable with the power supply device, for outputting the DC power from the driving system to the power supply device; and an opening/closing device provided in an electric path between the external terminal and the driving system. The control device may control the opening/closing device to open the opening/closing device when the insulation decrease of the electric system is detected by the second detecting device.

With such a configuration, it is possible to avoid a situation where insulation decrease is detected in the power supply device, but it cannot be determined whether the insulation decrease took place in the electrically powered vehicle or the power supply device. Therefore, according to the power supply system, convenience can be improved when there is insulation decrease in the electrically powered vehicle.

The foregoing and other features, aspects and advantages of the present disclosure will become more apparent from the following detailed description of the present disclosure when taken in conjunction with the accompanying drawings.

BRIEF DESCRIPTION OF THE DRAWINGS

FIG. 7 collectively shows actions of the vehicle depending on modes of the electrically powered vehicle and results of determination for insulation decrease of an electric system.

DETAILED DESCRIPTION OF EMBODIMENTS

Figure 1:
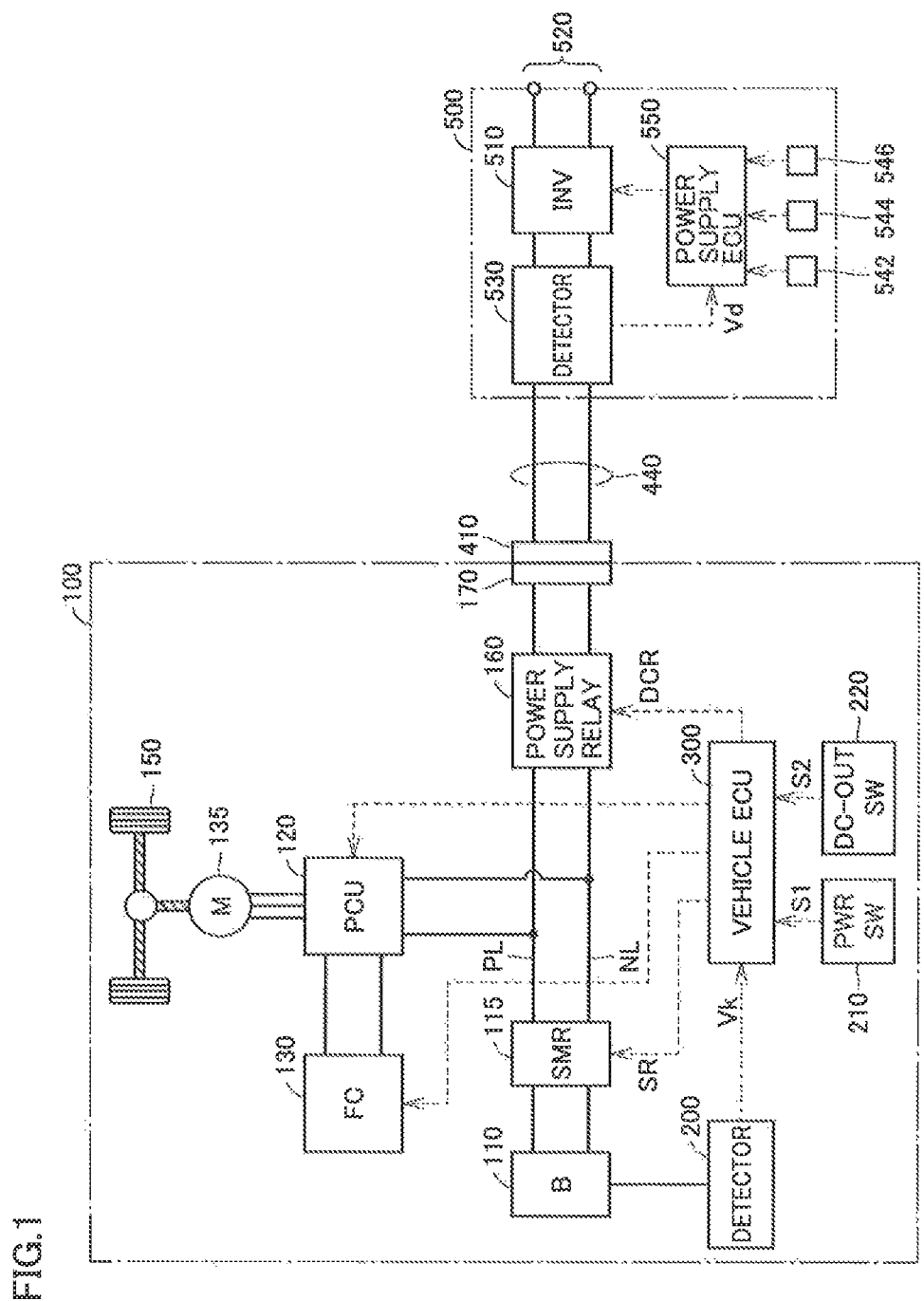
FIG. 1 is an entire configuration diagram of a power supply system according to an embodiment of the present disclosure.

The following describes an embodiment of the present disclosure in detail with reference to figures. It should be noted that the same or corresponding portions are given the same reference characters and are not described repeatedly.

FIG. 1 is an entire configuration diagram of a power supply system according to an embodiment of the present disclosure. Referring to FIG. 1, the power supply system includes an electrically powered vehicle 100 and a power supply device 500. Electrically powered vehicle 100 includes a power storage device 110, a system main relay (SMR) 115, a power control unit (PCU) 120, a fuel cell (FC) 130, a motor 135, and a driving wheel 150.

Power storage device 110 is a rechargeable DC power source, and is configured to include a secondary battery such as a lithium ion battery or a nickel hydrogen battery. The electric power stored in power storage device 110 is supplied to PCU 120 or is supplied to power supply device 500 electrically connected to an external terminal 170 by a power supply cable 440 (hereinafter, power supply from electrically powered vehicle 100 to power supply device 500 is also referred to as "external power supply"). Moreover, power storage device 110 is capable of storing electric power generated by fuel cell 130 and electric power generated by motor 135 during of vehicle braking.

SMR 115 is provided between power storage device 110 and each of power lines positive line and negative line (PL and NL). SMR 115 is controlled by a signal SR from a vehicle ECU 300 and is in a close state (conductive state) during traveling of the vehicle. Moreover, SMR 115 is controlled to be also in the close state during the external power supply.

PCU 120, which is electrically connected to power lines PL and NL, is controlled by vehicle ECU 300, PCU 120 converts electric power among power lines PL and NL, motor 135, and fuel cell 130. For example, PCU 120 is configured to include: an inverter that receives DC power from power lines PL, NL, and fuel cell 130 to drive motor 135; a converter that adjusts the voltage level of the DC power; and the like.

Fuel cell 130 is a DC power source for causing chemical reaction between hydrogen and oxygen to generate electric power, and is configured to include, for example, a solid polymer fuel cell. It should be noted that the type of the fuel cell is not limited to this and various types of known fuel cells can be employed. The electric power generated by fuel cell 130 is supplied to motor 135 through PCU 120, is charged to power storage device 110, or is supplied to power supply device 500 during the external power supply.

Motor 135 is an AC electrical machine, and is constructed of, for example, a permanent-magnet type synchronous motor including a rotor having a permanent magnet embedded therein. Motor 135 is driven by the inverter included in PCU 120, and drives driving wheel 150. Moreover, during braking of the vehicle, motor 135 receives rotation force of driving wheel 150 and generates electric power. The electric power generated by motor 135 is stored in power storage device 110 via PCU 120.

Electrically powered vehicle 100 further includes a power supply relay 160 and external terminal 170. External terminal 170 is configured to be connectable with terminal 410 of power supply cable 440 connected to power supply device 500. The configurations of external terminal 170 and terminal 410 of power supply cable 440 are not limited; by way of an example, terminal 410 is constructed of a power supply connector whereas external terminal 170 is constructed of an outlet that can be engaged with the power supply connector. External terminal 170 is provided, for example, in a luggage compartment, and has a tip provided with an openable/closable cap.

Power supply relay 160 is provided between power lines PL, NL and external terminal 170. Power supply relay 160 is controlled by a signal DCR from vehicle ECU 300, and is controlled to be in the close state (conductive state) during the external power supply via external terminal 170. It should be noted that although details will be described later, power supply relay 160 is controlled to come into an open state (power interruption state) when a detector 200 detects insulation decrease of the electric system.

It should be noted that driving power for traveling can be generated by power storage device 110, SMR 115, PCU 120, fuel cell 130, and motor 135, and in the description below, power storage device 110, SMR 115, PCU 120, fuel cell 130, and motor 135 will be also collectively referred to as "driving system". It should be also noted that this driving system, power supply relay 160, and external terminal 170 are also simply and collectively referred to as "electric system".

Electrically powered vehicle 100 further includes detector 200, vehicle ECU 300, a power switch 210, and a DC-OUT switch 220. Detector 200 is a device for detecting insulation decrease of the electric system of electrically powered vehicle 100. For example, detector 200 feeds the electric system with AC voltage having a predetermined frequency, produces a voltage value Vk decreasing according to insulation decrease of the electric system, and outputs it to vehicle ECU 300. The configuration of detector 200 will be described later.

Power switch 210 can be operated by a user, and provides vehicle ECU 300 with a signal S1, which is changed according to an operation by the user. By operating this power switch 210, the power state of electrically powered vehicle 100 is switched. Specifically, whenever power switch 210 is operated, the power state is sequentially switched among an accessory mode, an IG-ON mode, and power OFF. In the accessory mode, an electric component such as an accessory socket can be used. In the IG-ON mode, all the electric components can be used.

DC-OUT switch 220 can be also operated by the user, and provides vehicle ECU 300 with a signal S2, which is changed according to an operation by the user. By operating this DC-OUT switch 220, the external power supply is enabled. By way of an example, when DC-OUT switch 220 is operated with the IG-ON mode being selected by means of power switch 210, and terminal 410 of power supply cable 440 is connected to external terminal 170, electrically powered vehicle 100 is brought into an "external power supply mode", and when a power supply start switch 542 (described below) is operated in power supply device 500, the external power supply is started.

Vehicle ECU 300 includes a CPU (Central Processing Unit), a memory, an input/output buffer, and the like (none of them shown), and performs various types of control in electrically powered vehicle 100. Representatively, when a predetermined traveling permission condition is established, vehicle ECU 300 performs traveling control of the vehicle by controlling SMR 115 and power supply relay 160 to come into the close state and the open state respectively, driving PCU 120 and fuel cell 130. By way of an example, when power switch 210 is operated with the brake pedal being operated, electrically powered vehicle 100 is brought into a traveling mode and SMR 115 and power supply relay 160 are brought into the close state and the open state, respectively.

When brought into the external power supply mode described above, vehicle ECU 300 controls SMR 115 and power supply relay 160 to come into the close state (conductive state). Accordingly, power supply device 500 (described below) is electrically connected to the electric system of electrically powered vehicle 100. Further, based on voltage value Vk received from detector 200, vehicle ECU 300 determines an insulation state of the electric system describing whether or not there is decrease of insulation resistance. Moreover, when it is determined that there is insulation decrease in the electric system, vehicle ECU 300 controls power supply relay 160 to come into the open state. In other words, vehicle ECU 300 prohibits the external power supply. The detailed configuration of vehicle ECU 300 will be described later.

Meanwhile, power supply device 500 includes an inverter 510, a terminal 520, a detector 530, a power supply ECU 550, power supply start switch 542, a power supply stop switch 544, and an emergency stop switch 546.

Inverter 510 is electrically connected to power supply cable 440, and is controlled by power supply ECU 550. Inverter 510 converts, into AC power, DC power received from electrically powered vehicle 100 via power supply cable 440, and supplies the AC power to an external load (not shown in the figure), which is electrically connected to terminal 520. By way of an example, inverter 510 converts the DC power received from power supply cable 440 into AC power having a commercial power frequency, and supplies it to the external load.

Detector 530 is provided in a power supply path (DC line) at the input side of inverter 510. Detector 530 is a device for detecting insulation decrease in the power supply path when power supply device 500 is electrically connected to the electric system of electrically powered vehicle 100. Detector 530 produces a voltage value Vd, which is changed according to insulation decrease in the power supply path, and outputs it to power supply ECU 550. The configuration of detector 530 will be described later.

It should be noted that occurrence of insulation decrease in at least one of power supply device 500 and the electric system of electrically powered vehicle 100 can be detected by detector 530, but in some embodiments, detector 530 may not distinguish whether the insulation decrease took place in power supply device 500 or the electric system of electrically powered vehicle 100 electrically connected to power supply device 500.

When power supply start switch 542, which can be operated by the user, is operated while electrically powered vehicle 100 is in the external power supply mode, the external power supply is started. When power supply stop switch 544, which can be also operated by the user, is operated while the external power supply is being performed, the external power supply is stopped. When emergency stop switch 546, which can be also operated by the user, is operated while the external power supply is being performed, the external power supply is stopped urgently.

Power supply ECU 550 includes a CPU, a memory, an input/output buffer, and the like (none of them shown), and performs various types of control in power supply device 500. Power supply ECU 550 controls inverter 510 in accordance with the operations of power supply start switch 542, power supply stop switch 544, and emergency stop switch 546. Moreover, power supply ECU 550 receives voltage value Vd from detector 530, and determines, based on a change in voltage value Vd, the insulation state (for example, whether or not there is decrease of insulation resistance) of the power supply path extending to the external load.

It should be noted that when insulation decrease is detected based on the detection result provided by detector 530, power supply ECU 550 provides a notification thereof to vehicle ECU 300 of electrically powered vehicle 100. The notification from power supply ECU 550 to vehicle ECU 300 can be provided via, for example, a signal line (not shown) provided in power cable 440.

Figure 2:
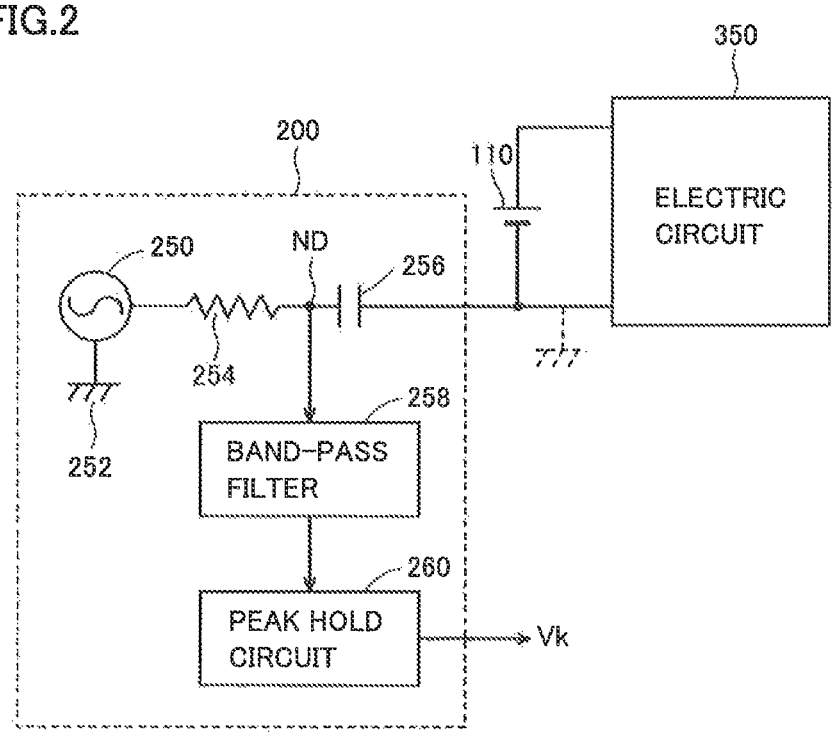
FIG. 2 shows a configuration of a detector of an electrically powered vehicle shown in FIG. 1.

FIG. 2 shows a configuration of detector 200 of electrically powered vehicle 100 shown in FIG. 1. It should be noted that the configuration of detector 200 shown here is exemplary and detector 200 is not necessarily limited to such a configuration. With reference to FIG. 2, detector 200 includes an AC power source 250, a vehicle chassis 252, a resistance element 254, a capacitor 256, a band-pass litter 258, and a peak hold circuit 260.

AC power source 250 and resistance element 254 are connected in series between a node ND and vehicle chassis 252. Capacitor 256 is connected between node ND and the negative electrode of power storage device 110. It should be noted that in FIG. 2, circuits subsequent to SMR 115 when seen from power storage device 110 in FIG. 1 are comprehensively shown as an electric circuit 350.

AC power source 250 outputs an AC voltage with a low frequency, such as an AC voltage of 0 to 5 V with a frequency of 2.5 Hz. Band-pass filter 258 is connected to node ND, extracts a frequency component (for example, 2.5 Hz) of the AC voltage output by AC power source 250, and outputs it to peak hold circuit 260. Peak hold circuit 260 holds the peak of the AC voltage received from band-pass filter 258, and outputs held voltage value Vk to vehicle ECU 300. This voltage value Vk is decreased when there is insulation malfunction (decrease of insulation resistance) in the electric system to which detector 200 is connected.

Figure 3:
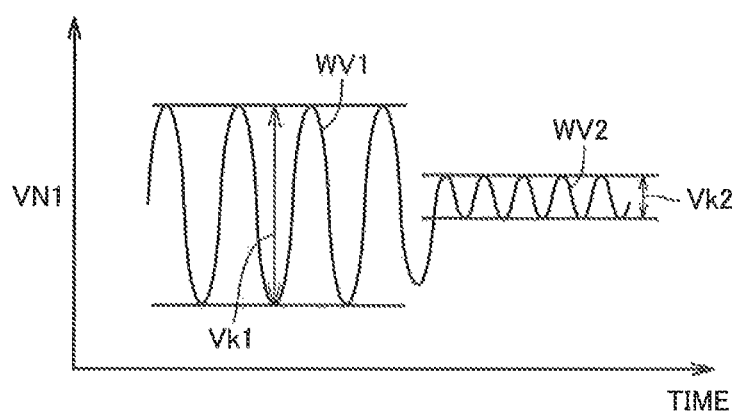
FIG. 3 illustrates a method of detecting insulation malfunction by the detector shown in FIG. 2.

FIG. 3 illustrates a method of detecting the insulation malfunction by detector 200 shown in FIG. 2. With reference to FIG. 3 and FIG. 2, an AC voltage VN1 is the AC voltage output from band-pass filter 258A. A waveform WV1 is a waveform of AC voltage VN1 when there is no insulation malfunction (decrease of insulation resistance) in power storage device 110 and electric circuit 350 (i.e., the electric system described above). A waveform WV2 is a waveform of AC voltage VN1 when there is insulation malfunction in at least one of power storage device 110 and electric circuit 350.

When AC voltage VN1 has waveform WV1, peak hold circuit 260 assumes a voltage value Vk1 between peaks as voltage value Vk and outputs it to vehicle ECU 300. Meanwhile, when AC voltage VN1 has waveform WV2, peak hold circuit 260 assumes a voltage value Vk2 (where Vk2 is less than Vk1) between peaks as voltage value Vk and outputs it to vehicle ECU 300. By providing an appropriate threshold value to distinguish voltage value Vk1 and voltage value Vk2 from each other, the insulation decrease of the electric system can be detected based on voltage value Vk.

Figure 4:
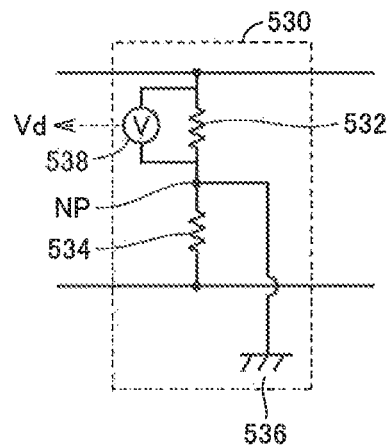
FIG. 4 shows a configuration of the detector of the power supply device shown in FIG. 1.

FIG. 4 shows a configuration of detector 530 of power supply device 500 shown in FIG. 1. It should be noted that the configuration of detector 530 shown here is also exemplary and detector 530 is not necessarily limited to such a configuration. With reference to FIG. 4, detector 530 includes resistance elements 532 and 534, and a voltage sensor 538.

Resistance elements 532 and 534 have, for example, a high resistance value of kilohm level, and are connected in series between a pair of power lines in the power supply path. Resistance elements 532 and 534 are connected to each other at a connection point, i.e., a neutral point NP electrically connected to case 536 of power supply device 500. Voltage sensor 538 detects a voltage across resistance element 532, and outputs detected voltage value Vd to power supply ECU 550.

Such a detector is also referred to as a high-resistance neutral grounding system, and is capable of detecting decrease of insulation resistance of the power supply path by detecting a change in voltage value Vd. It should be noted that voltage sensor 538 may detect a voltage across resistance element 534. Moreover, the decrease of insulation resistance can be also detected by detecting a change in current flowing from neutral point NP to case 536 instead of detecting the voltage.

With reference to FIG. 1 again, in the power supply system according to the present embodiment, DC power is output from electrically powered vehicle 100 to power supply device 500, converted into AC power in power supply device 500, and then supplied to the external load (not shown) electrically connected to terminal 520. When power supply device 500 is electrically connected to the electric system of electrically powered vehicle 100, detector 530 of power supply device 500 detects the insulation state (for example, whether or not there is decrease of insulation resistance) of the power supply system.

When detector 530 detects insulation decrease of the power supply system, in some embodiments, detector 530 may not determine whether the insulation decrease took place in the electric system of electrically powered vehicle 100 or power supply device 500. When the insulation decrease took place in electrically powered vehicle 100 and power supply device 500 is then connected thereto, detector 530 of power supply device 500 detects the insulation decrease, whereby power supply device 500 may not be used due to the safety function. In such a case, power supply device 500 may not be used even though power supply device 500 itself is normal, with the result that the power supply system may be significantly deteriorated in terms of convenience. For example, even when the power supply device is thereafter connected to a vehicle free from insulation decrease, electric power cannot be supplied from the vehicle.

Here, electrically powered vehicle 100 includes detector 200, which detects the insulation state (for example, whether or not there is decrease of insulation resistance) of the electric system of electrically powered vehicle 100. Hence, in the power supply system according to the present embodiment, when the insulation decrease of the electric system is detected by detector 200 in electrically powered vehicle 100, power supply relay 160 is controlled to come into the open state (for example, a power interruption state). Accordingly, while it is may not be possible to determine whether the insulation decrease took place in electrically powered vehicle 100 or power supply device 500, power supply device 500 can avoid being unused when power supply device 500 itself is normal after detecting insulation decrease in power supply device 500.

Figure 5:
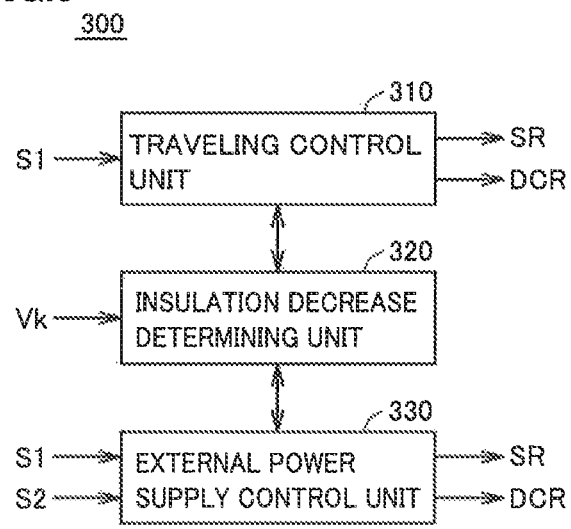
FIG. 5 is a function block diagram of a vehicle ECU shown in FIG. 1.

FIG. 5 is a function block diagram of vehicle ECU 300 shown in FIG. 1. With reference to FIG. 5, vehicle ECU 300 includes a traveling control unit 310, an insulation decrease determining unit 320, and an external power supply control unit 330.

Traveling control unit 310 controls traveling of electrically powered vehicle 100. When traveling control unit 310 receives signal S1 from power switch 210 and detects, based on signal S1, an operation of power switch 210 with the brake pedal (not shown) being operated, traveling control unit 310 brings SMR 115 and power supply relay 160 into the close state and the open state respectively, which is a traveling mode.

Insulation decrease determining unit 320 receives voltage value Vk from detector 200, and determines whether or not there is insulation decrease of the electric system based on voltage value Vk in accordance with the above-described method. The determination for insulation decrease is performed while SMR 115 is in the close state (conductive state) during traveling or the like, and the result of determination (for example, a vehicle insulation decrease flag) is stored in a storage device not shown in the figures.

Here, during the external power supply, insulation decrease determining unit 320 may not perform the determination for insulation decrease in some embodiments. Specifically, insulation decrease determining unit 320 receive, from external power supply control unit 330, a notification that the external power supply is currently being performed or not, and insulation decrease determining unit 320 stops the operation of detector 200 when the external power supply is currently being performed, i.e., when power supply relay 160 is in the close state. This is due to the following reason: if detector 200 is operated while power supply relay 160 is in the close state, detector 200 interferes with detector 530 of power supply device 500 electrically connected to the electric system, thereby adversely affecting the detection function of detector 530.

It should be noted that the stop of operation of detector 200 can be implemented by, for example, electrically separating detector 200 from the electric system by means of a relay not shown. Moreover, the determination for insulation decrease by detector 200 may be performed before the start of the external power supply (while SMR 115 is in the close state and power supply relay 160 is in the open state).

External power supply control unit 330 controls power supply from electrically powered vehicle 100 to power supply device 500. External power supply control unit 330 receives signal S1 from power switch 210, and receives signal S2 from DC-OUT switch 220. When external power supply control unit 330 detects an operation of DC-OUT switch 220 based on signal S2 and detects connection between external terminal 170 and terminal 410 of power supply cable 440 (FIG. 1) while the power state of electrically powered vehicle 100 is in the IG-ON mode due to an operation of power switch 210, external power supply control unit 330 controls both SMR 115 and power supply relay 160 to come into the close state (conductive state). This is an external power supply mode.

Here, when external power supply control unit 330 receives the result of determination as to the insulation decrease of the electric system from insulation decrease determining unit 320 and the insulation decrease of the electric system has been detected by insulation decrease determining unit 320, external power supply control unit 330 controls power supply relay 160 to come into the open state (power interruption state). Accordingly, when the insulation decrease is detected in electrically powered vehicle 100, power supply device 500 is electrically separated from the electric system of electrically powered vehicle 100. It should be noted that in the description above, external power supply control unit 330 may control power supply relay 160 to come into the open state and may control SMR 115 to come into the open state, or may maintain SMR 115 to be in the close state until power switch 210 or DC-OUT switch 220 is operated (operated to be turned off).

Figure 6:
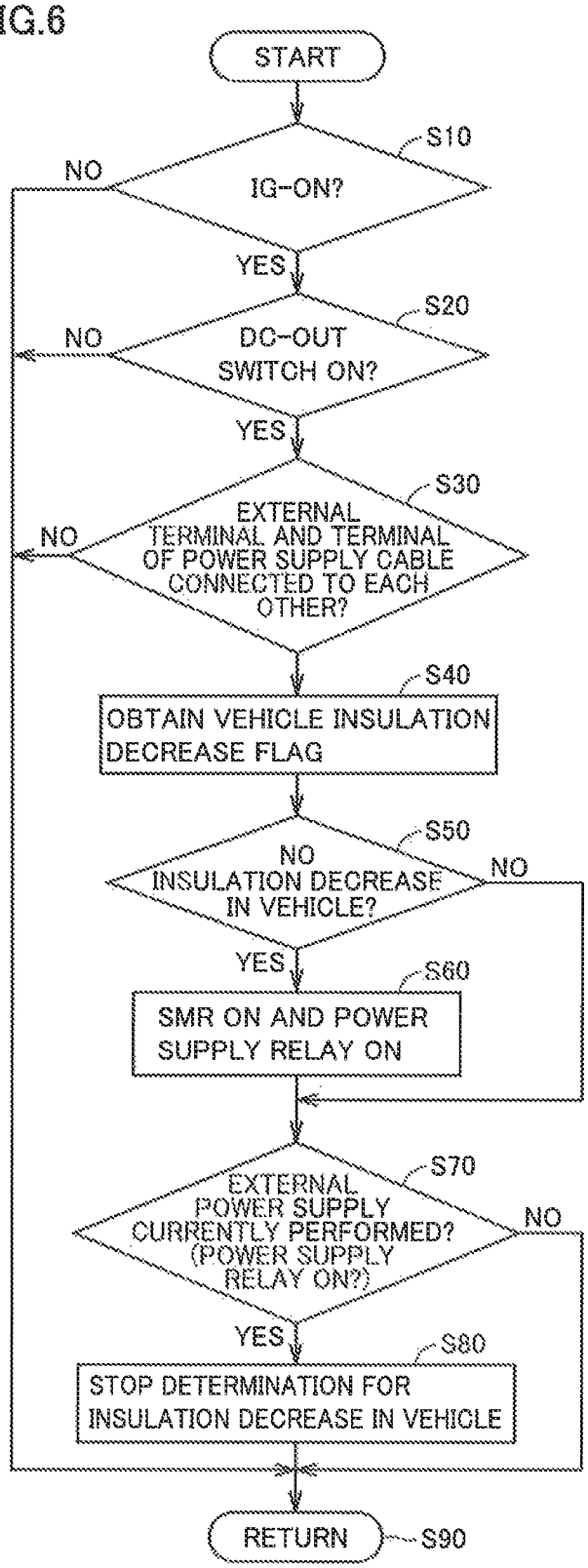
FIG. 6 is a flowchart for illustrating a process procedure of the vehicle ECU when external power supply is requested.

FIG. 6 is a flowchart for illustrating a process procedure of vehicle ECU 300 when the external power supply is requested. It should be noted that each step in the flowchart is implemented by invoking a program stored in vehicle ECU 300 in advance from a main routine and executing it at a predetermined cycle or executing it whenever a predetermined condition is established.

With reference to FIG. 6 and FIG. 1, when power switch 210 is operated by the user to bring the power state into the IG-ON mode (YES in step S10), vehicle ECU 300 determines whether or not DC-OUT switch 220 has been operated (step S20). When it is determined that DC-OUT switch 220 has been operated in the IG-ON mode (YES in step S20), vehicle ECU 300 determines whether or not terminal 410 of power supply cable 440 is connected to external terminal 170 (step S30). It should be noted that the determination process in step S30 may be performed before the process of step S10 or may be performed between the process of step S10 and the process of step S20.

When it is determined in step S30 that terminal 410 of power supply cable 440 is connected to external terminal 170 (YES in step S30), vehicle ECU 300 reads and obtains, from the storage device (not shown), the vehicle insulation decrease flag indicating that there is the insulation decrease of the electric system in electrically powered vehicle 100 or not (step S40), thereby determining whether or not there is insulation decrease in the electric system of electrically powered vehicle 100 (step S50).

When it is determined that there is no insulation decrease in the electric system (YES in step S50), vehicle ECU 300 turns on SMR 115 and power supply relay 160 (close state) (step S60). On the other hand, when it is determined in step S50 that there is insulation decrease in the electric system (NO in step S50), the process of step S60 is skipped and the process proceeds to step S70.

In other words, power supply relay 160 is normally off (open state) as long as there is no request for the external power supply, and when there is the insulation decrease of the electric system in electrically powered vehicle 100, SMR 115 and power supply relay 160 are not turned on (for example, in close state), thus prohibiting the external power supply to power supply device 500.

Next, vehicle ECU 300 determines whether or not the external power supply is currently being performed (step S70). Whether or not the external power supply is currently being performed can be determined by determining whether or not power supply relay 160 is on (close state), for example. When it is determined that the external power supply is currently being performed (YES in step S70), vehicle ECU 300 stops the operation of detector 200 to stop the determination for insulation decrease in electrically powered vehicle 100 (step S80). As described above, during the external power supply, the electric system of electrically powered vehicle 100 and power supply device 500 are electrically connected to each other and detector 200 and detector 530 of power supply device 500 interfere with each other, so that the operation of detector 200 is stopped and the insulation state of the power supply system is detected by detector 530 of power supply device 500.

As described above, in the present embodiment, when the insulation decrease of the electric system is detected by detector 200 in electrically powered vehicle 100, power supply relay 160 is controlled to come into the open state, thereby prohibiting the external power supply from electrically powered vehicle 100. Accordingly, power supply device 500 is electrically separated from electrically powered vehicle 100, whereby power supply device 500 can avoid from being unused when power supply device 500 itself is normal after detecting insulation decrease in power supply device 500 even though it may not be possible to determine whether the insulation decrease took place in electrically powered vehicle 100 or power supply device 500. Therefore, according to the present embodiment, convenience can be improved when there is insulation decrease in electrically powered vehicle 100.

Moreover, according to the present embodiment, since the operation of detector 200 in electrically powered vehicle 100 is stopped while power supply relay 160 is the close state, detector 530 of power supply device 500 for detecting the insulation decrease of the power supply system during the external power supply can be prevented from interfering with detector 200 of electrically powered vehicle 100.

Moreover, in the present embodiment, when the insulation decrease is detected by detector 530 of power supply device 500 while power supply relay 160 is in the close state (during the external power supply), power supply relay 160 is controlled to come into the open state in electrically powered vehicle 100. Accordingly, in power supply device 500, it is possible to avoid a situation that whether the insulation decrease has took place in electrically powered vehicle 100 or power supply device 500 cannot be determined.

Moreover, according to the present embodiment, since the driving system includes fuel cell 130 and power storage device 110, the external power supply from power storage device 110 can be promptly performed, and when an amount of charges stored in power storage device 110 is decreased, a large amount of electric power that can be generated by fuel cell 130 can be used for the external power supply by charging power storage device 110 using fuel cell 130.

It should be noted that in the above-mentioned embodiment, the external power supply may be disabled by controlling power supply relay 160 to come into the open state when the insulation decrease of the electric system is detected by detector 200 in electrically powered vehicle 100; however, even in the case where the external power supply is disabled due to the insulation decrease of the electric system, it may permit traveling of electrically powered vehicle 100 upon request for the traveling of electrically powered vehicle 100. Even when there is insulation decrease in electrically powered vehicle 100, electrically powered vehicle 100 itself may be capable of traveling, so that electrically powered vehicle 100 can travel to a service station or the like for the sake of inspection and repair, thereby further improving convenience when there is insulation decrease in electrically powered vehicle 100.

FIG. 7 collectively shows actions of the vehicle depending on the modes of electrically powered vehicle 100 and the results of determination for insulation decrease of the electric system. With reference to FIG. 7, in the external power supply mode, the external power supply is permitted when detector 200 determines that the insulation state of the electric system of electrically powered vehicle 100 is normal. It should be noted that as described above, when the external power supply is started, the operation of detector 200 is stopped. On the other hand, when the insulation decrease in electrically powered vehicle 100 is detected by detector 200, the external power supply is disabled as described above.

In the traveling mode, when the insulation state of the electric system is normal, electrically powered vehicle 100 is permitted to travel. In addition, in the traveling mode, electrically powered vehicle 100 is also permitted to travel even when the insulation decrease of the electric system is detected. For electrically powered vehicle 100 having the insulation decrease therein, the external power supply is disabled but the traveling is permitted and electrically powered vehicle 100 can therefore travel to a service station or the like for the sake of inspection and repair, thus improving convenience of the vehicle.

It should be noted that in the description above, detector 200 corresponds to one example of a "detecting device" and a "second detecting device" in the present disclosure, and detector 530 corresponds to one example of a "first detecting device" in the present disclosure. It should be also noted that power supply relay 160 corresponds to one example of an "opening/closing device" in the present disclosure, and vehicle ECU 300 corresponds to one example of a "control device" in the present disclosure.

Although the present disclosure has described and illustrated embodiments in detail, it is clearly understood that the same is by way of illustration and example only and is not to be taken by way of limitation.

What is claimed is:

1. An electrically powered vehicle comprising:
   an electric system included in the vehicle;
   a detector configured to detect insulation decrease of the electric system; and
   a control device that controls the electric system,
   wherein the electric system includes
     a driving system that generates driving power for traveling,
     an external terminal for outputting DC power from the driving system to outside the vehicle, and
     an opening/closing device provided in an electric path between the external terminal and the driving system,
   wherein the external terminal is configured to be connectable with a converter separated from the vehicle,
   the converter converts the DC power output from the external terminal into AC power and supplies the AC power to an external load, and
   the control device is configured to:
     (i) when the converter is not connected to the external terminal, control the opening/closing device to open the opening/closing device; and
     (ii) when the insulation decrease of the electric system is detected by the detecting device before the converter is connected to the external terminal, control the opening/closing device to keep the opening/closing device in the open state even if the converter is connected to the external terminal.

2. The electrically powered vehicle according to claim 1, wherein when the insulation decrease of the electric system is detected by the detecting device before the converter is connected to the external terminal, the control device is configured to control the opening/closing device to keep the opening/closing device in an open state and permit the vehicle to travel using the driving system.

3. The electrically powered vehicle according to claim 1, wherein the control device is configured to:
   when the insulation decrease of the electric system is not detected by the detecting device before the converter is connected to the external terminal, control the opening/closing device to close the opening/closing device when the converter is connected to the external terminal; and
   while the control device controls the opening/closing device to close the opening/closing device, stop an operation of the detected device.

4. The electrically powered vehicle according to claim 3, wherein the control device controls the opening/closing device to open the opening/closing device when receiving a notification from an external device while the control device controls the opening/closing device to close the opening/closing device,
   wherein the external device receives the DC power from the external terminal, and the notification indicates that insulation decrease has been detected in the external device.

5. The electrically powered vehicle according to claim 1, wherein
   the driving system includes a fuel cell, and
a power storage device that stores electric power generated by the fuel cell.

6. A power supply system comprising:
an electrically powered vehicle configured to output DC power to outside the vehicle; and
a power supply device that converts the DC power output from the electrically powered vehicle into AC power and supplies the AC power to an external load,
wherein the power supply device includes a first detecting device that detects insulation decrease of a power supply path to the external load when the power supply device is electrically connected to the electrically powered vehicle, and
the electrically powered vehicle includes
an electric system included in the vehicle,
a second detecting device that detects insulation decrease of the electric system, and
a control device that controls the electric system,
wherein the electric system includes
a driving system that generates driving power for traveling,
an external terminal, configured to be connectable with the power supply device, for outputting the DC power from the driving system to the power supply device, and
an opening/closing device provided in an electric path between the external terminal and the driving system, and
wherein the control device is configured to:
(i) when the power supply device is not connected to the external terminal, control the opening/closing device to open the opening/closing device; and
(ii) when the insulation decrease of the electric system is detected by the second detecting device before the power supply device is connected to the external terminal, control the opening/closing device to keep the opening/closing device in an open state even if the converter is connected to the external terminal.

* * * * *